(12) United States Patent
Kang et al.

(10) Patent No.: US 10,608,644 B1
(45) Date of Patent: Mar. 31, 2020

(54) FREQUENCY DIVIDER

(71) Applicant: GEAR RADIO ELECTRONICS CORP., Zhubei, Hsinchu County (TW)

(72) Inventors: Yu-Hsuan Kang, Hsinchu (TW); Cheng-Lung Li, Zhubei (TW)

(73) Assignee: GEAR RADIO ELECTRONICS CORP., Zhubei (TW)

( * ) Notice: Subject to any disclaimer, the term of this patent is extended or adjusted under 35 U.S.C. 154(b) by 0 days.

(21) Appl. No.: 16/418,780

(22) Filed: May 21, 2019

(51) Int. Cl.
*H03K 21/10* (2006.01)
*H03K 21/08* (2006.01)
*H03K 19/20* (2006.01)

(52) U.S. Cl.
CPC ............. *H03K 21/10* (2013.01); *H03K 21/08* (2013.01); *H03K 19/20* (2013.01)

(58) Field of Classification Search
CPC ........ H03K 21/00; H03K 21/08; H03K 21/10; H03K 21/38
USPC .......................................... 327/115, 117, 118
See application file for complete search history.

(56) References Cited

U.S. PATENT DOCUMENTS

| 4,443,887 | A | 4/1984 | Shiramizu |
| 7,092,479 | B1 | 8/2006 | Reid et al. |
| 7,881,422 | B1* | 2/2011 | Chiang ................ H03K 23/544 377/47 |
| 2010/0128837 | A1 | 5/2010 | Prakah et al. |

OTHER PUBLICATIONS

Cicero S. Vaucher et al., "A Family of Low-Power Truly Modular Programmable Dividers in Standard 0.35-μm CMOS Technology", IEEE Journal of Solid-State Circuits, vol. 35, No. 7, Jul. 2000, pp. 1039-1045.

* cited by examiner

*Primary Examiner* — William Hernandez
(74) *Attorney, Agent, or Firm* — Innovation Capital Law Group, LLP; Vic Lin

(57) ABSTRACT

An embodiment of the present invention discloses a frequency divider. The frequency divider comprises a ripple counter unit, a reload signal output unit and a state extend unit. The ripple counter unit is configured to output a plurality of frequency divided signals according to a clock signal. The reload signal is output unit, coupled to the ripple counter unit, and is configured to determine whether the ripple counter unit is in a termination state and output a reload signal according to the frequency divided signals and a mask signal. The state extend unit is coupled to the ripple counter unit and the reload signal output unit, and is configured to output the mask signal according to the reload signal.

8 Claims, 4 Drawing Sheets

FREQUENCY DIVIDER

BACKGROUND OF THE INVENTION

Field of the Invention

The invention relates to a frequency divider, especially to a multi-modulus frequency divider circuit.

Description of the Related Art

Frequency dividers are widely used in modern wireless communication systems. In the circuit architecture of some frequency dividers, a ripple counter is used as a means of frequency division. However, the problem of delays of the ripple counter may become more and more serious as increasing the number of counters in the ripple counter.

SUMMARY OF THE INVENTION

An embodiment of the present invention discloses a frequency divider. The frequency divider comprises a ripple counter unit, a reload signal output unit and a state extend unit. The ripple counter unit is configured to output a plurality of frequency divided signals according to a clock signal. The reload signal is output unit, coupled to the ripple counter unit, and is configured to determine whether the ripple counter unit is in a termination state and output a reload signal according to the frequency divided signals and a mask signal. The state extend unit is coupled to the ripple counter unit and the reload signal output unit, and is configured to output the mask signal according to the reload signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
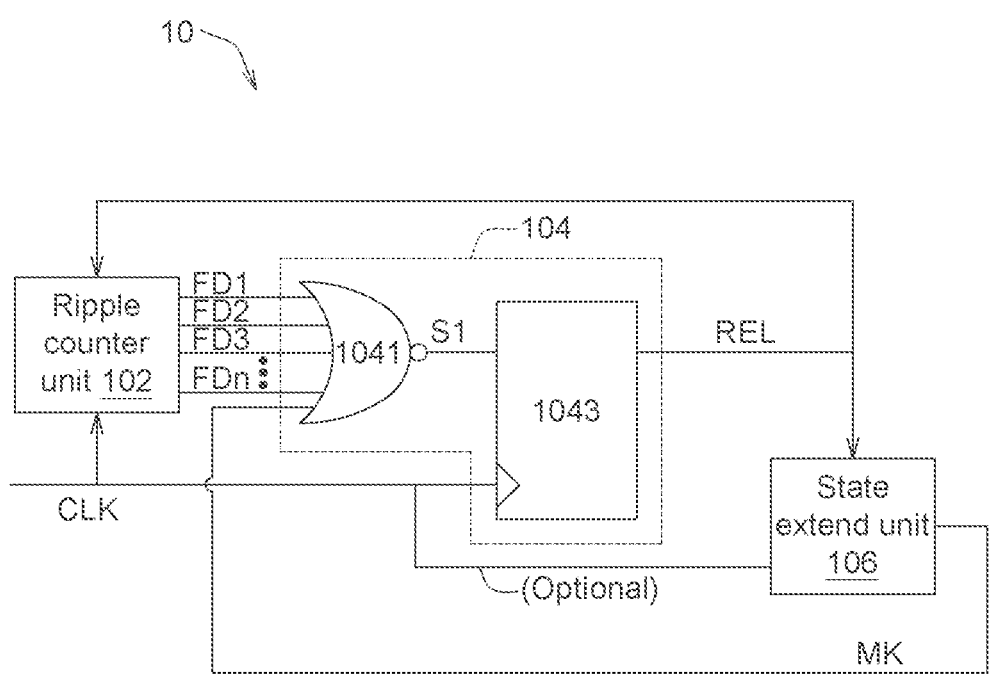
FIG. 1 shows a block diagram of a frequency divider according to an embodiment of the present invention.

Referring to FIG. 1, FIG. 1 shows a block diagram of a frequency divider according to an embodiment of the present invention. The frequency divider 10 includes a ripple counter unit 102, a reload signal output unit 104 and a state extend unit 106.

The ripple counter 102 is configured to receive a clock signal CLK and output a number of frequency divided signals FD1~FDn, wherein the frequencies of the frequency divided signals FD1~FDn may be 1/N of the frequency of the clock signal CLK, where for different frequency divided signals, N may be different integers. The ripple counter unit 102 may be implemented by various approaches which are well known by skilled person in the art. In an embodiment, the ripple counter unit 102 may include a number of D flip-flops which are connected in cascade and configured to output the frequency divided signals FD1~FDn respectively.

The reload signal output unit 104 is coupled to the ripple counter unit 102. The reload signal output unit 104 is configured to receive the clock signal CLK, a mask signal MK and the frequency divided signals FD1~FDn, and to output a reload signal REL according to the clock signal CLK, the mask signal MK and the frequency divided signals FD1~FDn. Specifically, the reload signal output unit 104 may determine whether the ripple counter unit 102 is in a termination state according to the clock signal CLK, the mask signal MK and the frequency divided signals FD1~FDn. If the reload signal output unit 104 determines that the ripple counter unit 102 is in the termination state, the reload signal output unit 104 may output "TRUE" (e.g., a digital "1") as the reload signal REL. In an embodiment, the reload signal output unit 104 includes a combinational logic (i.e., a multi-input NOR gate in this embodiment) 1041 and a D flip-flop 1043. The multi-input NOR gate 1041 is configured to receive the mask signal MK and the frequency divided signals FD1~FDn, and to output a first signal S1 according to the mask signal MK and the frequency divided signals FD1~FDn. In an embodiment, the multi-input NOR gate may be implemented by a number of NOR and NAND gates (i.e., two-input NOR and NAND gates) which are connected in cascade. The D flip-flop 1043 is coupled to the multi-input NOR gate. The D flip-flop 1043 is configured to receive the clock signal CLK and the first signal S1, and to output the reload signal REL according to the clock signal CLK and the first signal S1. The reload signal is transmitted to the ripple counter unit 102. The ripple counter unit 102 may determine whether to reset and load a new clock signal according to the reload signal REL, wherein the new clock signal may be different from the clock signal CLK. For example, if the reload signal REL indicates that the ripple counter unit 102 is in the termination state, the ripple counter 102 may reset and reload a new clock signal.

The state extend unit 106 is coupled to the ripple counter unit 102 and the reload signal output unit 104. The state extend unit 106 is configured to receive the reload signal REL and the clock signal CLK, and to output the mask signal MK according to the reload signal REL and the clock signal CLK. Specifically, the mask signal MK is used to extend the termination state of the ripple counter unit 102.

Figure 2:
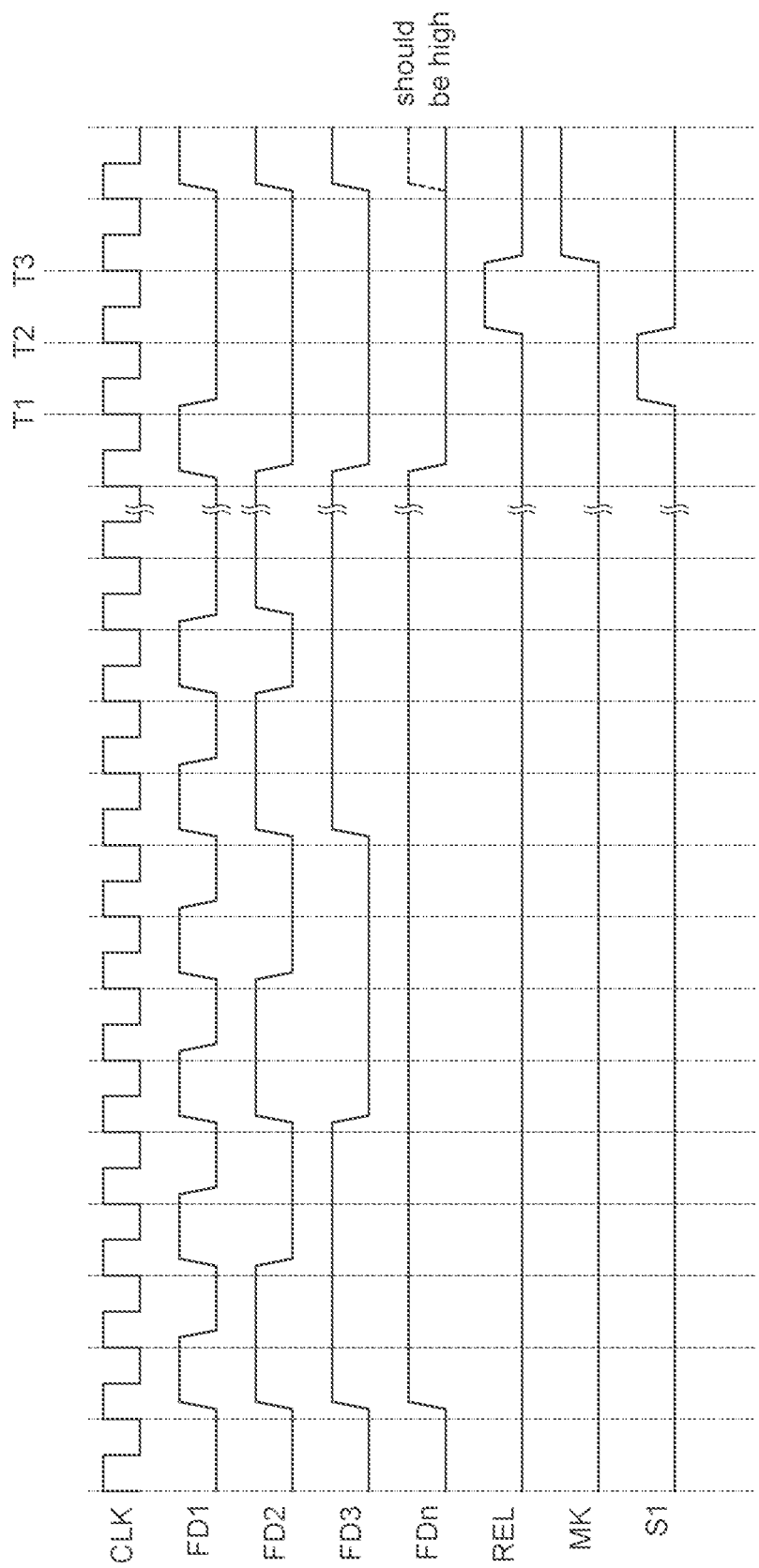
FIG. 2 shows a signal timing diagram of a frequency divider according to an embodiment of the present invention.

Next, the principle of the frequency divided may be illustrated with reference to FIG. 2. FIG. 2 shows a signal timing diagram of the frequency divider 10 according to an embodiment of the present invention. In this embodiment, the frequency of the frequency divided signal FD1 is ½ of the frequency of the clock signal CLK, the frequency of the frequency divided signal FD2 is ¼ of the frequency of the clock signal CLK, the frequency of the frequency divided signal FD3 is ⅛ of the frequency of the clock signal CLK and so on. The first signal S1 may be high when the frequency divided signals FD1~FDn and the mask signal MK are low. In other words, if any one of the frequency divided signals FD1~FDn and the mask signal MK is high, the first signal may be low. As shown in FIG. 2, at T1, the frequency divided signals FD1~FDn and the mask signal MK are low, and the first signal S1 goes high for a clock cycle. At T2, the reload signal REL goes high for a clock cycle. At T3, the mask signal MK goes high for one or more clock cycles. During a period that the mask signal MK is high, the first signal S1 may be kept low regardless of the frequency divided signals FD1~FDn. For example, in this embodiment, the ripple counter unit 102 is configured to output digital "000 . . . 01" as the frequency divided signals FD1~FDn when the reload signal REL goes high (i.e., the frequency divided signals FD1~FD(n−1) are "0" and the frequency divided signal FDn is "1"). However, due to the long delay of the nth ripple counter of the ripple counter unit 102, the frequency divided signal FDn output by the nth ripple counter of the ripple counter unit 102 may probably be in a low state (i.e., a digital "0") after reloading. This will cause the first signal S1 to become high when it should not be high without the mask signal MK. By adjusting the pulse width of the mask signal MK, such unknown output generated by ripple counter unit 102 during the period when MK is high can be masked.

Figure 3:
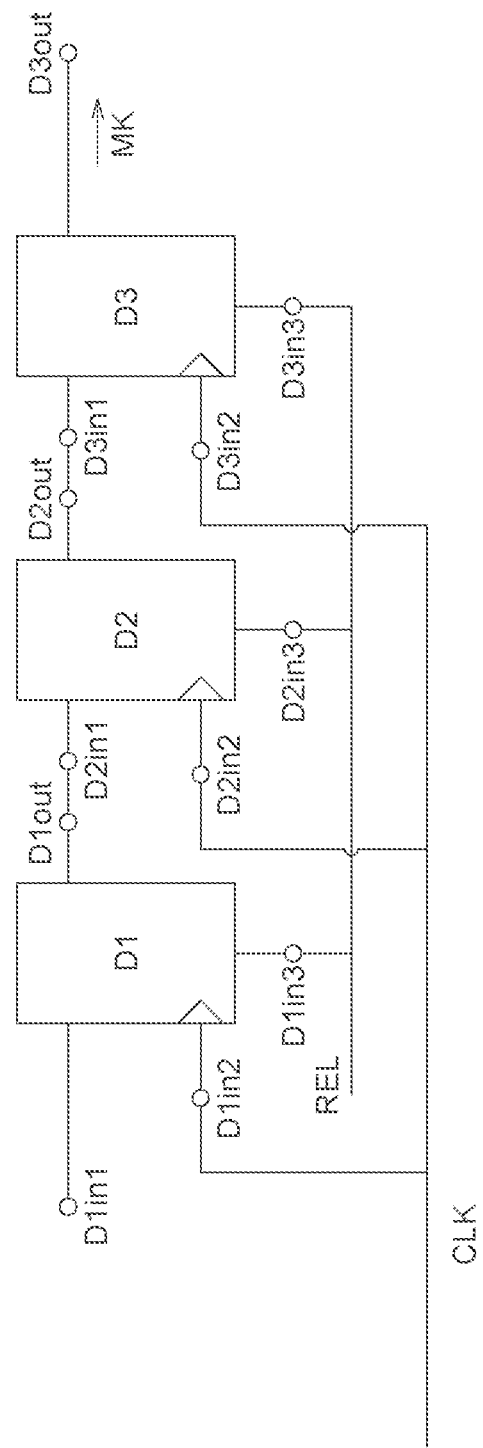
FIG. 3 shows a block diagram of a state extend unit according to an embodiment of the present invention.

Referring to FIG. 3, FIG. 3 shows a block diagram of a state extend unit according to an embodiment of the present invention. The state extend unit 106a includes a number stages of D flip-flops D1~D3 which are connected in cascade. Each of the D flip-flops D1~D3 includes a first input node D1in1~D3in1, a second input node D1in2~D3in2, a third input node D1in3~D3in3 and an output node D1out~D3out. The first input node D1in1 of a first stage D1 of the D flip-flops D1~D3 is coupled to a reference voltage Vref which represents a digital "0" (e.g., ground). The output node D3out of a last stage D3 of the D flip-flops D1~D3 is configured to output the mask signal MK and is coupled to the reload signal output unit 104. The second input node D1in2~D3in2 of the D flip-flops D1~D3 is configured to receive the clock signal CLK. The third input node D1in3~D3in3 is configured to receive the reload signal REL or a signal which relates to the reload signal REL, for example, an inverse of the reload signal REL. For each of one or more stages D2 between the first stage D1 and the last stage D3, the first input node D2in1 is coupled to the output node D1out of a previous stage D1 of itself, and the output node D2out is coupled to the first input node D3in1 of a next stage D3 of itself. The D flip-flops D1~D3 may determine whether to force the outputs on the output nodes D1out~D3out to "1" according to the reload signal REL or the signal which relates to the reload signal REL. When the D flip-flops D1~D3 do not force the outputs on the output nodes D1out~D3out to "1", the outputs on the output nodes D1out~D3out may be determined based on the signals input to the first nodes D1in1~D3in1 and the clock signal CLK.

Figure 4:
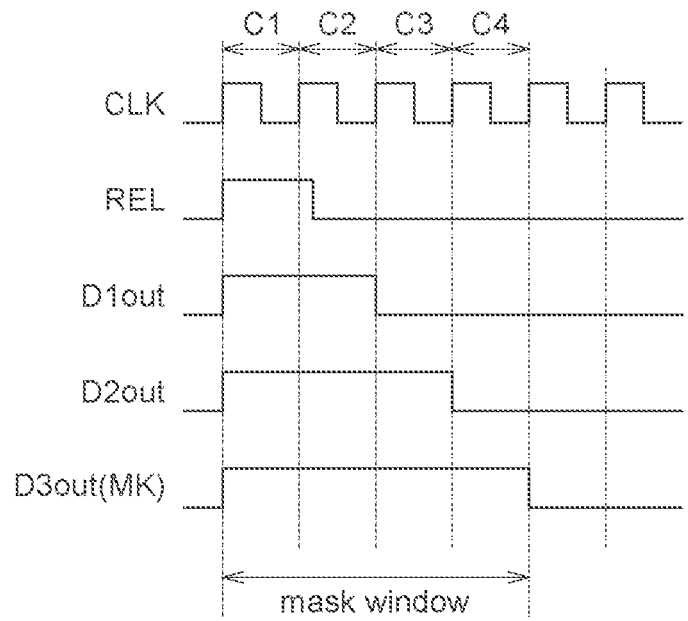
FIG. 4 shows a signal timing diagram of a state extend unit according to an embodiment of the present invention.

Referring to FIG. 4, FIG. 4 shows a signal timing diagram of a state extend unit according to an embodiment of the present invention. During the clock cycle C1, the output signal from the output node D1out~D3out may be forced to "1" since reload signal REL goes high. In the next three clock cycles C2~C4, since the reload signal REL becomes low, the output signals from the output nodes D1out~D3out may change to 111, 011, 001 and 000 orderly, wherein "0" refers to a digital "0" which represents by a low voltage state, and "1" refers to a digital "1" which represents by a high voltage state. Thereby, the mask signal MK that maintains high for four clock cycles may be generated.

Figure 5:
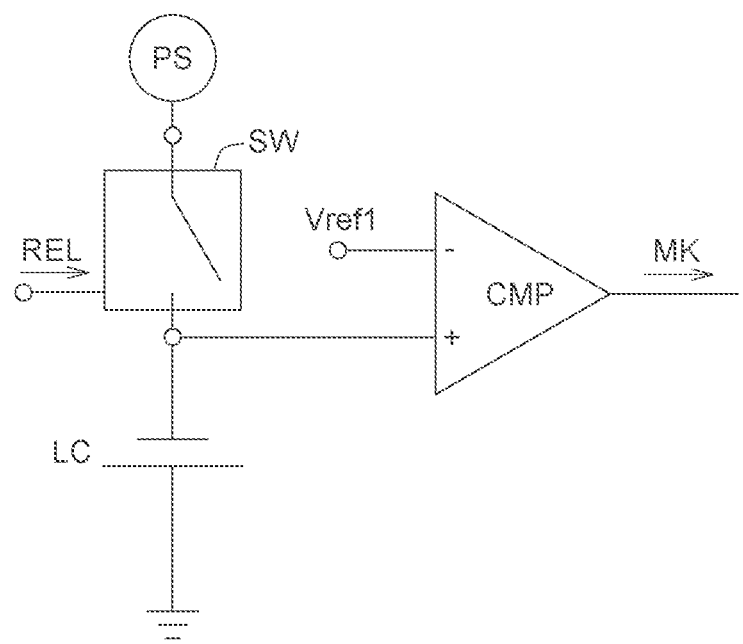
FIG. 5 shows a block diagram of a state extend unit according to another embodiment of the present invention.

Referring to FIG. 5, FIG. 5 shows a block diagram of a state extend unit according to another embodiment of the present invention. The state extend unit 106b includes a power source PS, a switch SW, a leaky capacitor LC and a comparator CMP.

The power source PS may be a voltage source or a current source. A first node of the switch SW is coupled to the power source PS. The switch is determined to be turned on or off according to the reload signal REL. In this embodiment, when the reload signal REL is high, the switch SW may be turned on (i.e., in a short circuit state), and when the reload signal REL is low, the switch SW may be turned off (i.e., in an open circuit state).

A first node of the leaky capacitor LC is coupled to a second node of the switch SW. A second node of the leaky capacitor is coupled to ground. In an embodiment, the leaky capacitor LC may be implemented by a transistor capacitor, for example, a pFET capacitor.

A first input node of the comparator CMP is coupled to the second node of the switch SW and the first node of the leaky capacitor LC. A second input node of the comparator CMP is coupled to a reference voltage Vref1. An output node of the comparator CMP is configured to output the mask signal MK. The comparator CMP may compare the voltage of the second node of the leaky capacitor LC with the reference voltage Vref1. If the voltage of the second node of the leaky capacitor LC is greater than the reference voltage Vref1, the comparator CMP may output high (i.e., a digital "1") as the mask signal MK; if the voltage of the second node of the leaky capacitor LC is not greater than the reference voltage Vref1, the comparator CMP may output low (i.e., a digital "0") as the mask signal MK.

Next, the principle of the state extend unit 106b may be illustrated. When the reload signal REL goes high, the switch SW is turned on, and the power source PS may charge the leaky capacitor LC. When the voltage of the leaky capacitor LC is charged to be greater than the reference voltage Vref1, When the voltage of the capacitor is charged to be greater than the reference voltage, the comparator CMP outputs "1" as the mask signal MK. After the switch SW is turned off due to the reload signal REL turning to low, the leaky capacitor begins to leak. When the voltage of the leaky capacitor LC is not greater than the reference voltage Vref1 due to leakage, the comparator CMP outputs "0" as the mask signal. That is, the period from when the voltage of the leaky capacitor LC is charged to be greater than the reference voltage Vref1 until the voltage of the leaky capacitor LC is not greater than the reference voltage due to leakage, the mask signal may be "1". The period that the mask signal MK is held "1" may be determined by selecting the reference voltage Vref1 and/or the leaky capacitor LC.

It should be noted again that the above mentioned "high" and "low" refer to "a digital high voltage" and "a digital low voltage" respectively, and are equivalent to "1" (digital "1") and "0" (digital "0") respectively.

To conclude, the invention generates the mask signal based on the reload signal by the state extend unit, and feeds the mask unit to the reload signal output unit. The mask signal can mask the unknown signals generated by the ripple counter unit, so that glitches generated by the combinational logic due to the unknown signals may be avoided.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A frequency divider, comprising:
a ripple counter unit, configured to output a plurality of frequency divided signals according to a clock signal;
a reload signal output unit, coupled to the ripple counter unit, and configured to determine whether the ripple counter unit is in a termination state and output a reload signal according to the frequency divided signals and a mask signal; and a state extend unit, coupled to the ripple counter unit and the reload signal output unit, and configured to output the mask signal according to the reload signal, wherein the reload signal output unit comprises a combinational logic and a D flip-flop, the combinational logic is configured to output a first signal according to the frequency divided signals and the mask signal, the D flip-flop is coupled to the combinational logic, and is configured to output the reload signal according to the first signal and the clock signal.

2. The frequency divider according to claim 1, wherein the combinational logic is a multi-input NOR gate.

3. The frequency divider according to claim 1, wherein the state extend unit comprises a plurality of D flip-flop stages which are connected in cascade.

4. The frequency divider according to claim 3, wherein each of the D flip-flops comprises a first input node, a second input node, a third input node and an output node, the first input node of a first stage of the D flip-flops is coupled to a reference voltage, the output node of a last stage of the D flip-flops is configured to output the mask signal, the second input node of the D flip-flops is configured to receive the clock signal, the third input node is configured to receive the reload signal or a signal which relates to the reload signal, for each of one or more stages between the first stage and the last stage, the first input node is coupled to the output node of a previous stage of itself, and the output node is coupled to the first input node of a next stage of itself.

5. The frequency divider according to claim 4, wherein the reference voltage is digital low which represents a digital "0".

6. The frequency divider according to claim 4, wherein the D flip-flops determine whether to force outputs on the output nodes to "1" according to the reload signal or the signal which relates to the reload signal, and when the D flip-flops do not force the outputs on the output nodes to "1", the outputs on the output nodes are determined based on signals input to the first input nodes and the clock signal.

7. The frequency divider according to claim 1, wherein the state extend unit comprises a power source, a switch, a leaky capacitor and a comparator.

8. The frequency divider according to claim 7, wherein a first node of the switch is coupled to the power source, the switch is determined to be turned on or off according to the reload signal, a first node of the leaky capacitor is coupled to a second node of the switch, a second node of the leaky capacitor is coupled to ground, a first input node of the comparator is coupled to the second node of the switch and the first node of the leaky capacitor, a second input node of the comparator is coupled to a reference voltage, an output node of the comparator is configured to output the mask signal.

* * * * *